United States Patent [19]
Hassard et al.

[11] Patent Number: 6,072,181
[45] Date of Patent: Jun. 6, 2000

[54] IONIZING RADIATION DETECTOR

[75] Inventors: John Francis Hassard; Peter Choi, both of London, United Kingdom

[73] Assignee: Imperial College of Science, London, United Kingdom

[21] Appl. No.: 08/776,209

[22] PCT Filed: Jul. 21, 1995

[86] PCT No.: PCT/GB95/01724

§ 371 Date: Mar. 20, 1998

§ 102(e) Date: Mar. 20, 1998

[87] PCT Pub. No.: WO96/04572

PCT Pub. Date: Feb. 15, 1996

[30] Foreign Application Priority Data

Aug. 2, 1994 [GB] United Kingdom ............... 9415584

[51] Int. Cl.[7] ............................... H01L 31/00; G01T 1/24
[52] U.S. Cl. ............................... 250/370.01; 250/370.09; 250/370.1
[58] Field of Search ........................... 250/370.01, 370.1, 250/370.12, 370.14, 389, 390.12

[56] References Cited

U.S. PATENT DOCUMENTS 3,691,389  9/1972  Ellis et al. ............................ 257/443
3,824,680  7/1974  Kozlov et al. .
5,079,425  1/1992  Imai et al. .

FOREIGN PATENT DOCUMENTS 0 193 304 A2  9/1986  European Pat. Off. .
0 474 385 A2  3/1992  European Pat. Off. .
58-123488     7/1983  Japan .
62-120086     6/1987  Japan .

OTHER PUBLICATIONS

PCT International Search Report PCT/GB 95/01724.

*Primary Examiner*—Constantine Hannaher
*Assistant Examiner*—Albert Gagliardi
*Attorney, Agent, or Firm*—Wallenstein & Wagner, Ltd.

[57] ABSTRACT

An ionizing radiation detector comprises a flat substrate having a plurality of etched parallel ridges on one surface. The parallel sides of the ridges carry a thin layer of a conducting material, acting as an electrode. A particle or radiation beam to be detected impinges on the ridges, in a direction normal to the plane of the substrate, so causing electron/hole carriers production within the ridges. The carriers migrate to the electrodes, in a direction perpendicular to the beam, thereby inducing charge on the electrodes. The readout can be extremely rapid, since the carriers need to migrate only a very small distance to the side of the ridge.

29 Claims, 2 Drawing Sheets

IONIZING RADIATION DETECTOR

DESCRIPTION

1. Technical Field

The present invention relates to an ionizing radiation detector, and in particular to a detector suitable for detecting high energy radiation and/or charged or neutral particles.

2. Background of the Invention

A typical prior art detector is shown in FIG. 1. The detector comprises a flat sheet 10 of an insulating material such as diamond, having thin gold electrode coatings 12,14 on its upper and lower surfaces. The upper electrode coating 12 comprises a plurality of parallel readout strips which are aligned in a direction perpendicular to the plane of the paper in the Figure, and the lower electrode coating 14 comprises a further plurality of readout strips aligned in a direction parallel with the plane of the paper. A large potential difference V is maintained between the electrode coatings.

A charged particle following a path 16 through the diamond produces electron-hole pairs 18,20, which separate under the influence of the electric field and induce a charge on the readout strips. The energy of the particle can be determined by the amount of charge which is collected, and its position by the intersection of the upper and lower strips receiving the largest induced charges.

There are a number of disadvantages with this type of detector, in particular its relatively poor charge collection efficiency. The charge collection efficiency is typically limited by the charge intrinsic life time within the diamond, and this can only be made large if expensive diamond is used, having a large recombination length. In addition, the accuracy with which the particle can be located in the x-y plane is limited by the inevitable cross-talk between the readout channels. Finally, the detector is sensitive to particles coming in from a wide range of angles, which means that it is not particularly suited for imaging purposes. If imaging is to be required, it is normally necessary to incorporate a collimator in front of the detector to ensure that particles travelling at an angle to the normal to the detector surface are weeded out. Such collimators not only add to the cost of detection equipment, but also limit its sensitivity.

In an effort to improve detection efficiency, and to avoid the use of collimators, there have been a number of proposals to provide detectors which are deep in comparison with their width. Typically, a bundle or stack of several of these individual detectors are used together. Examples are shown in U.S. Pat. No. 4,891,521 and GB-A1559664. The devices shown in both of these documents appears to be specifically intended for high-rate data taking. The present invention, on the other hand, is concerned with providing a device which is at least in principle capable of extremely high time resolution and spatial resolution when detecting an individual event.

It is an object of the present invention at least to alleviate the problems of the prior art.

SUMMARY OF THE INVENTION

According to the present invention there is provided an ionizing radiation detector comprising a single wafer of a detector material, the wafer having a plurality of parallel sided grooves in a surface thereof thereby defining between the grooves a plurality of parallel sided detector elements, opposing sides of each element carrying opposing readout electrodes; and means for applying a potential difference between the opposing electrodes of each element to create an electric field across the element.

Also according to the present invention there is provided an ionizing radiation (or photo) detector comprising a substrate and a plurality of detector elements, having generally parallel sides, extending outwardly from a surface of the substrate, the sides carrying readout electrodes.

Such detectors of the present invention have many advantages, particularly for the construction of the type of detector working on the photoconducting principle. They are relatively cheap to manufacture, they can provide high sensitivity, extremely fast readouts, and they can provide very accurate positioning information with minimal cross talk between channels. It is anticipated that detectors of this type will find a multitude of uses, including medical imaging, high energy particle physics, combustion and plasma physics, ultra-violet detectors for use in astronomy and so on.

The size of the detector elements determines the ultimate resolution, the resolution being limited in the present invention merely by limitations in the fabrication process. Detector elements can be manufactured, for example by laser etching techniques, having a width of 10 micrometres or more. For optimal readout speed, it is preferred that the width of the detector elements be less than the recombination length of the material from which the detector elements are manufactured, so that a large proportion of the ionised electrons/holes reach the electrodes. The exact preferred width of the elements will of course depend upon the material used, but typically the width is likely to be between 20 and 100 $\mu$m. For special uses it would be possible to build devices having gaps between the ridges of as little as 1 $\mu$m; however, as this would require the use of ion beams the resultant device would inevitably be expensive.

The detector may be made from diamond, either natural or artificially grown. The diamond, if artificially grown, is preferably intrinsic (that is, not S doped). Suitable diamond growing techniques include CVD (chemical vapour deposition) and plasma enhanced CVD. These can be used as detectors for particles with energy from a few eV upwards. A typical characteristic of this type of diamond is that the carrier recombination length is small compared with that obtained in natural type IIA diamonds. The small recombination length normally results in poor collection of the charge carriers produced by an incoming particle in a detector of traditional design. The proposed detector geometry, however, enables the lateral dimension (width) to be sufficiently small to match the micrometre-size recombination length of standard grown diamond, without the need for expensive techniques to improve the quality of the diamond to increase the recombination length. Accordingly, the detector of the present invention is able to make use of relatively cheap, poor quality grown diamond (for example 6 $\mu$m recombination length) which at present is less desirable for use in detectors. It may also use slightly higher quality diamond (but still not of the highest quality) of between 80 and 100 $\mu$m recombination length.

Alternatively, the detector may comprise silicon or GaAs, for example a single wafer of either of these substances.

Preferably, the height of each detection element, measured in a direction parallel to its sides, is relatively large in comparison with its width, defined as the distance between the parallel sides. The aspect ratio (height/width ratio) is preferably at least as high as 10, and may be as much as 100 depending upon the application. The use of high aspect ratios enable detectors embodying the present invention to exhibit both high sensitivity (because a particle being detected traverses the entire length of the detector element)

and high speed (because the electrons/hole carriers only have a very short distance to travel before they reach the nearest electrode.

The greater the aspect ratio, the greater will be the directional sensitivity of the device. With large aspect ratios, it is possible to do away entirely with the collimators which are frequently found to be necessary with prior art detectors used in imaging applications. The device of the present invention should both be directional enough, and spatially accurate enough, to provide imaging without the use of separate collimators, given an appropriate disposition of detector elements, for example upper and lower orthogonal ridges as described below. The ridge length is preferably large in comparison with the ridge height and width.

It will be appreciated, of course, that the invention is not restricted to devices having detection elements which are higher than they are wide. Likewise, the invention is not restricted to any particular relationship between the spacing between the detector elements and the widths of the elements themselves. In some embodiments, it might be preferable to have very narrow spaces between the elements (compared with the widths of the elements themselves); in other embodiments it might be preferable for the spacing between the detector elements to be wider than the widths of the elements themselves.

The detector preferably comprises a generally flat wafer, with detector elements extending outwardly in a direction generally perpendicular to the plane of the wafer. In use, the detector is designed to be positioned so that the incoming particle or radiation beam being detected is normal to the plane of the wafer. In one preferred embodiment, the detector elements comprise a plurality of parallel ridges, etched, grown or otherwise formed in the front surface of the wafer. Where location in two dimensions is required, the wafer may be double-sided with a first series of parallel ridges on one side, and a second orthogonal series of parallel ridges on the other side. Two sets of readout devices may be provided so that the upper surface provides x position information and the lower surface y position information.

Where the detector elements comprise a plurality of parallel ridges, the lateral electrodes will produce a relatively large capacitative effect. This can be largely eliminated by arranging to match the impedance of each pair of electrodes with the impedance of the readout devices at the ends of the ridges (wires, amplifiers and so on). Effectively, what one is doing is treating the readout electrodes as transmission lines and matching the impedance of those transmission lines. This results in very much faster signal processing, and substantially reduced signal loss.

Depending upon the exact configuration, in particular the material of which the detector is made and the aspect ratio, various types of particle may be detected. Specifically, detectors embodying the present invention could be used for all types of charged particle detection and for photons. To obtain a greater signal strength when photons are to be detected, a layer of high-Z material may be placed on top of the detector elements to cause showering. Since the showering layer is immediately in front of the detector elements, very little additional cross-talk is introduced. With high aspect ratios, efficient gamma rays detection can also be achieved; self-collimation is critical here, since normal collimators generally lose too large a proportion of the sample. The detection of neutral particles such as neutrons may be enhanced by filling the spaces between the detector elements with an absorber material, such as a plastics material.

According to a further aspect of the invention there is provided an ionizing radiation (photo) detector comprising a plurality of detector elements having parallel sides, the sides carrying readout electrodes, the detector being arranged to operate with the electrodes parallel to an incoming particle or radiation beam to be detected.

Preferably, the height of the detector elements, in a direction perpendicular to the incoming beam, is relatively large in comparison with the width, defined as the distance between the parallel sides.

With at least certain embodiments of the present invention it is expected that charge readout times will be less 50 ps, probably less than 35 ps.

BRIEF DESCRIPTION OF THE DRAWINGS

The invention may be carried into practice in a number of ways and several specific embodiments will now be described, by way of example, with reference to the drawings, in which.

DETAILED DESCRIPTION OF THE PREFERRED EMBODIMENTS

Figure 1:
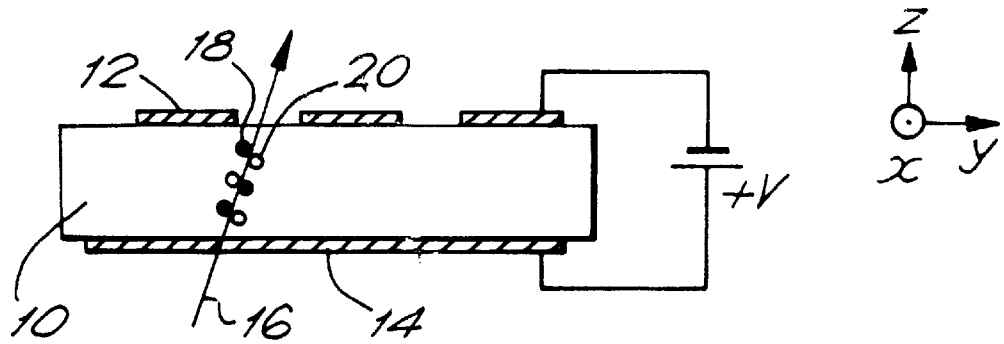
FIG. 1 shows a prior art detector.
Figure 2:
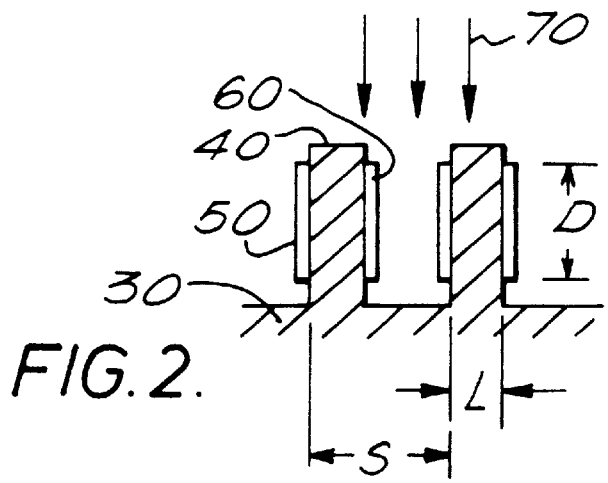
FIG. 2 is a cross-section through a detector embodying the present invention.
Figure 3:
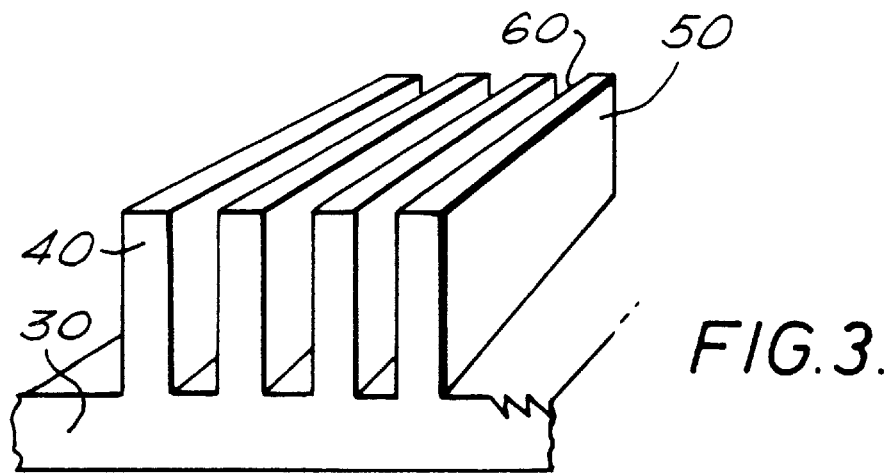
FIG. 3 is a perspective view of the detector of FIG. 2.

The preferred detector of the present invention is illustrated in FIGS. 2 and 3. It is a diamond detector and comprises a diamond substrate 30 having, on one surface, a plurality of parallel etched diamond ridges 40. On one side of each ridge there is a positive readout electrode 50, and on the other side a negative electrode 60. These are preferably conductors, but could instead be of a high-conductivity doped semi conductor material.

In use, the detector is positioned so that the substrate lies substantially normal to a particle or radiation beam 70 to be detected. An individual particle passing into one of the ridges creates ionised carriers, which rapidly migrate to the electrodes 50,60 by virtue of the large potential difference which is maintained between them. Charge is thereby induced on the electrodes, this charge being read off by readout devices (not shown) at the ends of the ridges.

The substrate and the ridges are preferably of diamond, which may either be natural or artificially grown. The ridges may either be grown, with the substrate, or they may be etched (for example with an eximer laser). The electrodes 50,60 may be of any suitable ohmic material, such as gold, tungsten, titanium and so on. Standard deposition techniques may be used to apply the metal as a thin coating to the sides of the ridges. Typically, the device may be made by etching the ridges, depositing the material, and then polishing the top surface.

It will be appreciated from FIG. 2 that the sensitivity of the device shown can be increased by making the value of D (or the height of the ridges) larger. The greater the height of the ridges, the larger the amount of material which a particle has to pass through, thereby increasing the ionisation within the device. The height of the ridge will normally be matched to the expected penetration depth of the particles to be detected. The readout speed and efficiency is determined by the width L of each of the ridges. Depending upon the particular application, the value of L may be as little as a few micrometers, or a larger value up to about 200 μm, and the value of D 10 μm or more. The signal-to-noise ratio is large, as there is negligible cross-talk between signals emanating from individual ridges. A typical substrate depth is around 100 μm, sufficiently thick to support the ridges and to be free-standing without requiring an additional supporting base.

Preferably, the device makes use of relatively poor quality diamond, having a recombination length of perhaps 6 μm or so.

The impedance of the readout devices (not shown) at the end of the ridges is preferably matched with the impedance of the electrodes 50,60, thereby increasing readout speed and reducing signal losses.

There are a number of ways in which a potential difference may be applied between the electrodes 50,60 shown in FIG. 2. In its simplest form, a voltage source may simply be connected between the two electrodes. Alternatively, the electrodes may be coupled to a resistor chain (not shown), the potential difference between the electrodes thereby being defined by the potential drop across the corresponding resistor.

Figure 4A:
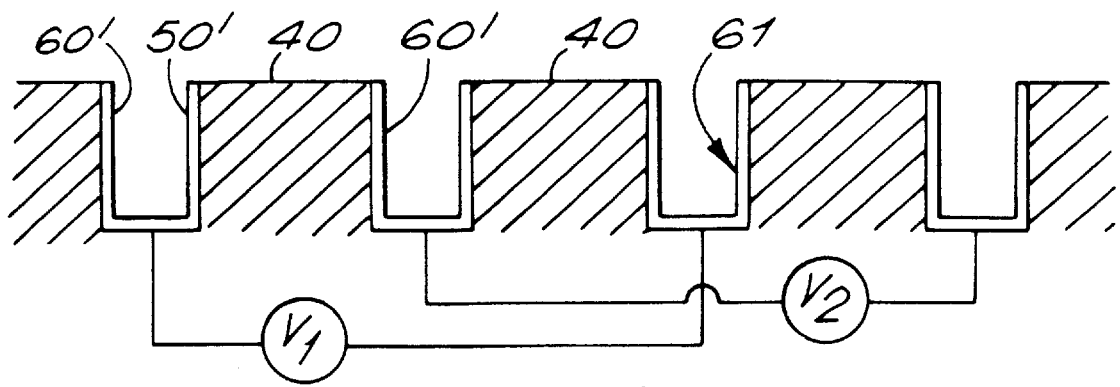
FIG. 4a shows another embodiment, the electrodes being connected in a bipolar voltage configuration.

Another embodiment is shown in FIG. 4, in which the electrodes are formed over the base and the sides of the space between the diamond ridges 40. This means, effectively, that each electrode 50' on the left side of a ridge 40 is electrically coupled with a corresponding electrode 60' on the right hand side of the next ridge in the sequence so that they together form a single U-shaped electrode 61. In the embodiment of FIG. 4a, first alternate pairs of U-shaped electrodes 61 are coupled via a first voltage source $V_1$, and second alternate pairs are coupled by a second voltage source $V_2$. Such a bipolar voltage configuration ensures that there is always a constant potential difference $V_1-V_2$ across each of the ridges 40.

Figure 4B:
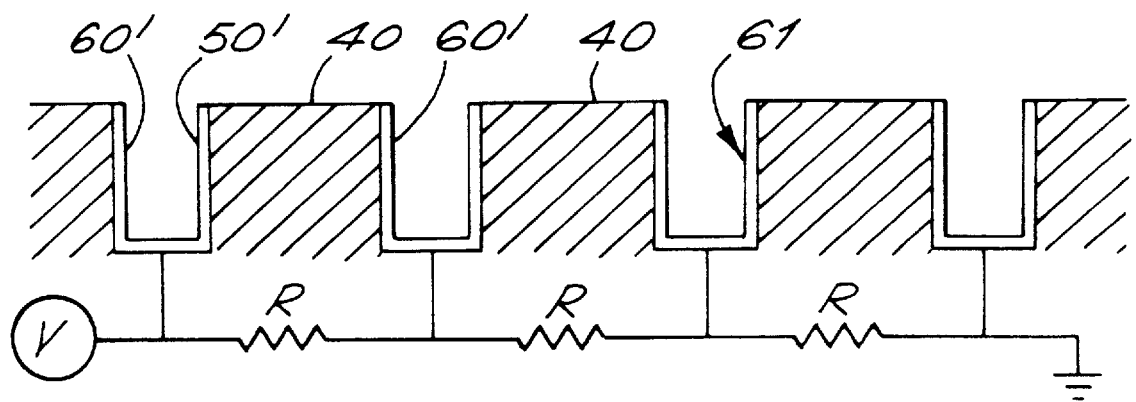
FIG. 4b shows the embodiment of FIG. 4a, the electrodes being connected in a resistor chain configuration.

An alternative method of applying voltages to the U-shaped electrodes 61 is shown in FIG. 4b. Here, a resistor chain is used to drop an input voltage V across a plurality of series resistors R. The voltage across each ridge 40 may be chosen by selecting appropriate values for V and R.

It will be understood, of course, that a similar bipolar voltage configuration or resistor chain voltage configuration may be used in conjunction with the embodiment of FIG. 2.

A typical potential difference across the ridge 40 may be in the region of 1 volt per μm. Substantially higher voltages could be used, if desired (since diamond has a very high breakdown potential), but there is generally no need for high potential differences since at greater voltages the carrier speed rapidly saturates.

In a further embodiment (not shown) a further parallel set of ridges, orthogonal to the first set, is provided on the lower surface of the substrate 30. These two perpendicular sets of ridges allow accurate x-y positioning of each detected particle.

The spaces between the ridges may be filled with a plastics material, or other absorber, thereby improving the capability of the detector to detect neutral particles.

Figure 5:
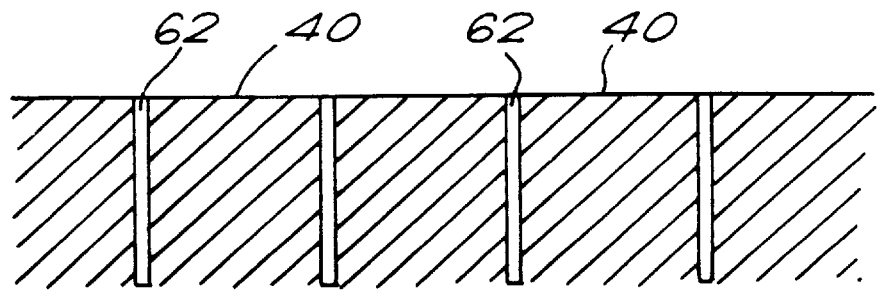
FIG. 5 shows yet a further embodiment.

Yet a further embodiment is shown in FIG. 5. Here, the spaces between the ridges 40 have become extremely narrow, and they each contain a separate electrode 62. Such an embodiment is, in many circumstances, preferred since the narrowness of the gaps between the ridges 40 produces only a small acceptance loss compared with the embodiments of FIGS. 2, 3 and 4. The width of the gap, and hence the width of the electrode 62, may depend primarily on how narrow a slot can be cut into the diamond substrate. The electrodes 62 may be coupled together in any convenient manner so as to produce a suitable potential difference across the ridges 40, for example using the approach of FIG. 4a or of FIG. 4b.

The detection of high energy electromagnetic radiation, such as gamma rays, may be improved by adding a showering layer (not shown) on top of the ridges. An incoming photon first strikes the showering layer, and the resulting shower then penetrates into one of the ridges below, providing a signal which be detected.

The ionizing radiation detector described above can provide extremely rapid charge readout, probably within 35 ps and certainly within 50 ps. These readout speeds cannot currently be achieved for any single pulse detector of comparable sensitivity and positional accuracy.

We claim:

1. An ionizing radiation detector comprising:
    a single wafer of a detector material, the wafer having a plurality of parallel sided grooves in a surface thereof thereby defining between the grooves a plurality of parallel sided detector elements, opposing sides of each element carrying opposing readout electrodes; and,
    means for applying a potential difference between the opposing electrodes of each element to create an electric field across the element.

2. The ionizing radiation detector as defined in claim 1 wherein the height of each detector element, measured in a direction parallel to its sides, is relatively large in comparison with its width, defined as the distance between the parallel sides.

3. The ionizing radiation detector as defined in claim 2 wherein the height/width ratio is greater than 10.

4. The ionizing radiation detector as defined in claim 2 wherein the height/width ratio is greater than 20.

5. The ionizing radiation detector as defined in claim 2 wherein the height/width ratio is greater than 50.

6. The ionizing radiation detector as defined in claim 2 wherein the height/width ratio is greater than 100.

7. The ionizing radiation detector as defined claim 1 wherein the width of each detector element, defined as the distance between the parallel sides, is less than the carrier recombination length of the material of which the wafer is made.

8. The ionizing radiation detector as defined in claim 1 wherein the width of each detector element, defined as the distance between the parallel sides, is less than 10 micrometers.

9. The ionizing radiation detector as defined in claim 1 wherein the wafer is of diamond.

10. The ionizing radiation detector as defined in claim 9 wherein the wafer is one of either a natural diamond or an artificially grown diamond.

11. The ionizing radiation detector as defined in claim 1 wherein the wafer is one of either an intrinsic silicon, a doped silicon, a GaAs, or a doped semiconductor material.

12. The ionizing radiation detector as defined in claim 1 wherein the wafer is generally planar, with the sides of the grooves being generally perpendicular to the general plane of the wafer.

13. The ionizing radiation detector as defined in claim 1 wherein the grooves are etched into the wafer.

14. The ionizing radiation detector as defined in claim 1 wherein the detector elements are grown integrally with the wafer.

15. The ionizing radiation detector as defined in claim 1 further including absorber material located within the grooves.

16. The ionizing radiation detector as defined in claim 1 further including shower-creating material in front of the detector elements.

17. The ionizing radiation detector as defined in claim 1 wherein the detector elements comprise a plurality of parallel ridges.

18. The ionizing radiation detector as defined in claim 17 further including readout devices adapted to read out signals from the electrodes at one end of the parallel ridges.

19. The ionizing radiation detector as defined in claim 17 comprising a first plurality of ridges on one side of the wafer and a second plurality of orthogonal ridges on an opposite side of the wafer.

20. The ionizing radiation detector as defined in claim 1 further including readout devices adapted to read out a signal from the electrodes, the readout devices being impedance matched to the electrodes.

21. The ionizing radiation detector as defined in claim 1 wherein each groove is narrower than about 100 $\mu$m.

22. The ionizing radiation detector as defined in claim 1 wherein each detector element has a width of less than about 100 $\mu$m.

23. The ionizing radiation detector as defined in claim 1 wherein one readout electrode of each detector element is electrically coupled to one readout electrode of an adjacent detector element.

24. The ionizing radiation detector as defined in claim 23 wherein the means for applying a potential difference is arranged to apply a first voltage to first alternate electrically coupled pairs of electrodes and a second voltage to second alternate electrically coupled pairs of electrodes.

25. The ionizing radiation detector as defined in claim 23 wherein the electrodes comprise a coating on the parallel sides and on a base of the grooves.

26. The ionizing radiation detector as defined in claim 25 wherein the means for applying a potential difference is arranged to apply a first voltage to first alternate electrically coupled pairs of electrodes and a second voltage to second alternate electrically coupled pairs of electrodes.

27. The ionizing radiation detector as defined in claim 1 wherein each groove is substantially entirely filled with a readout electrode.

28. The ionizing radiation detector as defined in claim 27 wherein the means for applying a potential difference is arranged to apply a first voltage to first alternate electrically coupled pairs of electrodes and a second voltage to second alternate electrically coupled pairs of electrodes.

29. The ionizing radiation detector as defined in claim 1 wherein the means for applying a potential difference comprises a voltage source and a resistor chain.

* * * * *